United States Patent [19]
Yang

[11] Patent Number: 5,482,900
[45] Date of Patent: Jan. 9, 1996

[54] METHOD FOR FORMING A METALLURGY SYSTEM HAVING A DIELECTRIC LAYER THAT IS PLANAR AND VOID FREE

[75] Inventor: Ming-Tzong Yang, Hsin Chu, Taiwan

[73] Assignee: United MicroElectronics Corporation, Hsinchu, Taiwan

[21] Appl. No.: 307,233

[22] Filed: Sep. 16, 1994

[51] Int. Cl.$^6$ .................................................. H01L 21/465
[52] U.S. Cl. ........................... 437/228; 437/195; 437/235
[58] Field of Search .................................... 437/195, 235, 437/228, 225, 238

[56] References Cited

U.S. PATENT DOCUMENTS

| 5,344,797 | 9/1994 | Pai et al. | 437/195 |
| 5,352,630 | 10/1994 | Kim et al. | 437/195 |
| 5,366,850 | 11/1994 | Chen et al. | 437/235 |

OTHER PUBLICATIONS

Wolf et al., Silicon Processing for VLSI Era, vol. 1 Process Technology, pp. 161, 555–559, 1986 Lattice Press.
Wolf, Silicon Processing for the VLSI Era, vol. II Process Technology, pp. 214–217, 279–285, 1990, Lattice Press.

Primary Examiner—George Fourson
Assistant Examiner—H. Jey Tsai
Attorney, Agent, or Firm—George O. Saile; Wolmar Stoffel

[57] ABSTRACT

A process where a blanket metal layer and a blanket $SiO_2$ layer are formed on the surface of a semiconductor substrate. A metallurgy pattern is formed in the metal and $SiO_2$ layers, and a thin conformal $SiO_2$ layer formed over the metallurgy pattern. A relatively thick non-conformal SOG layer of insulating material is formed over the $Si)_2$ layer, which is etched back. Subsequently a relatively thick CVD layer is deposited on the surface. The steps are repeated to form additional metallurgy levels.

10 Claims, 4 Drawing Sheets

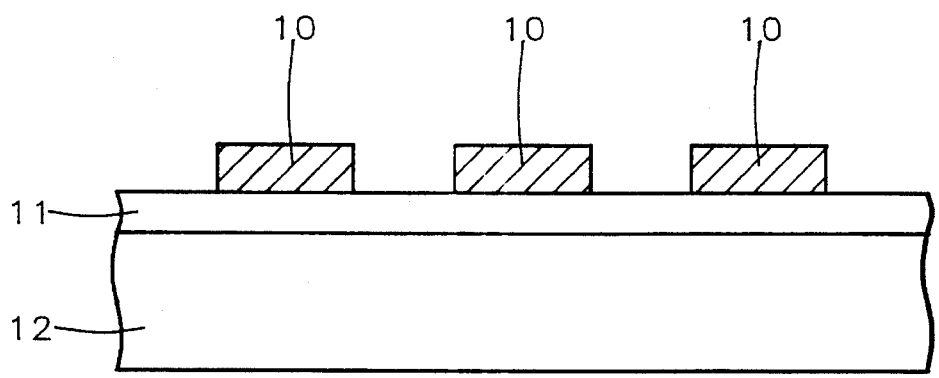
FIG. 1 – Prior Art
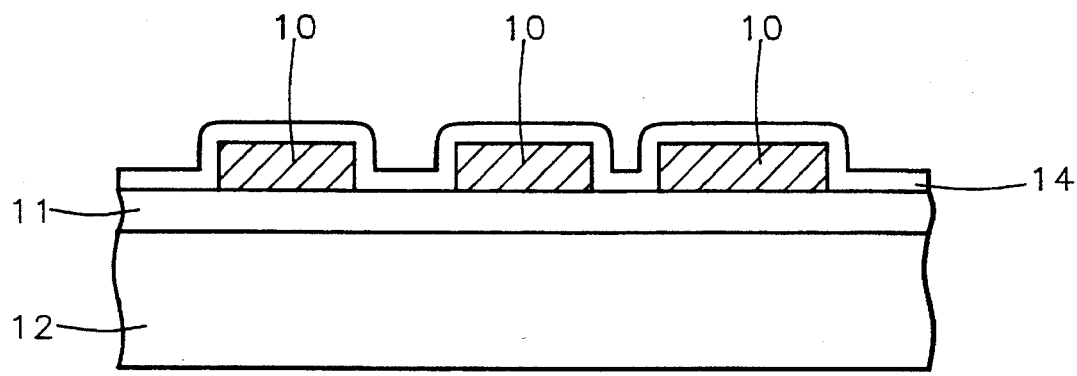
FIG. 2 – Prior Art
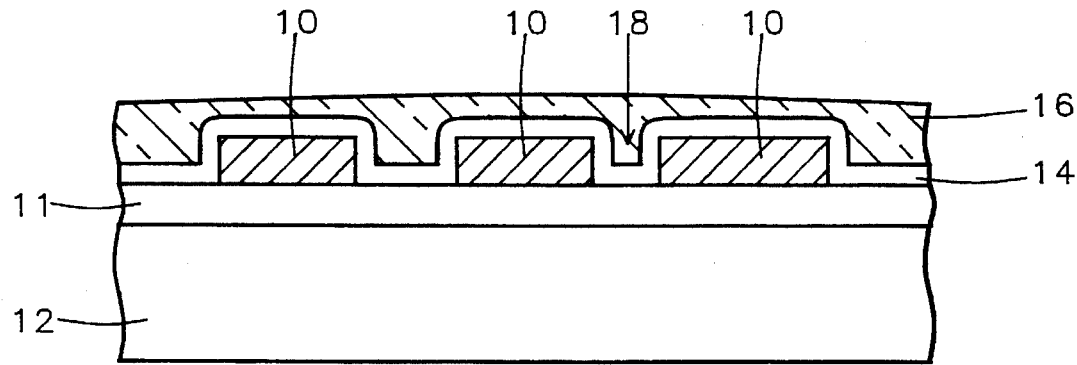
FIG. 3 – Prior Art

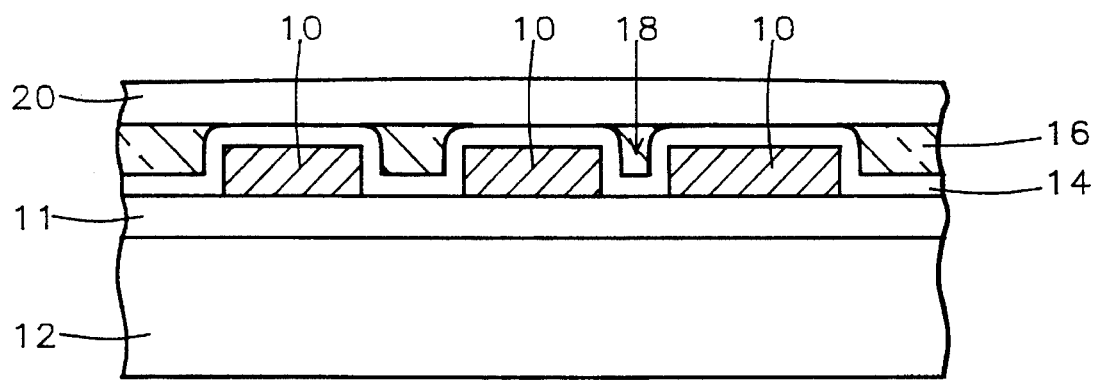
*FIG. 4 — Prior Art*
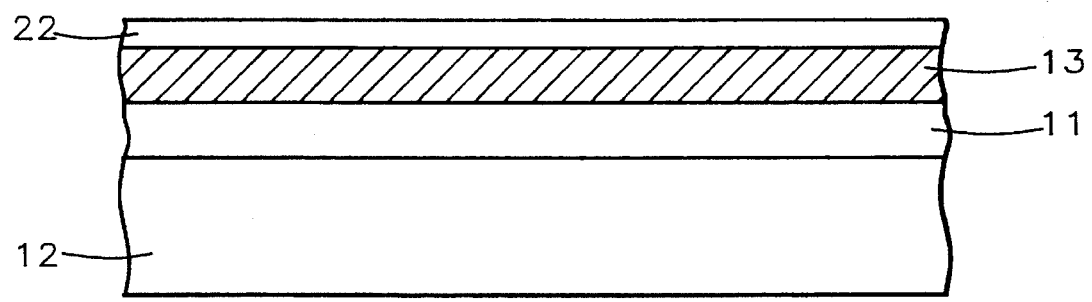
*FIG. 5*
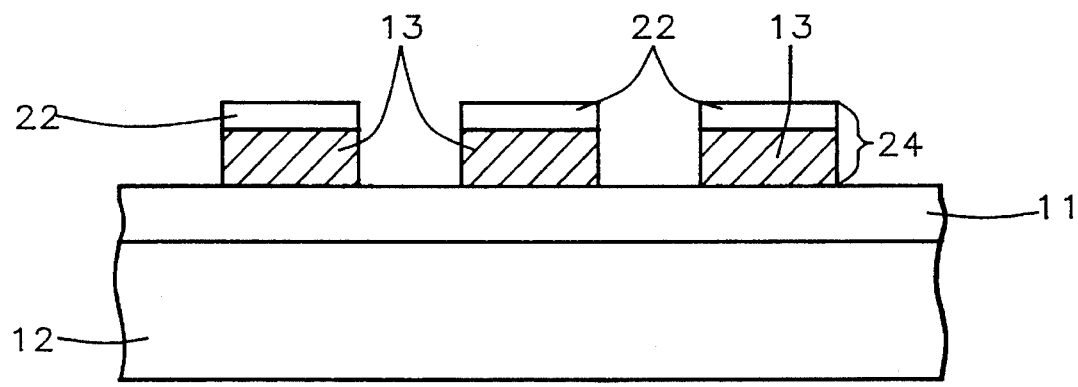
*FIG. 6*

METHOD FOR FORMING A METALLURGY SYSTEM HAVING A DIELECTRIC LAYER THAT IS PLANAR AND VOID FREE

BACKGROUND OF THE INVENTION

1. Field of the Invention

The present invention relates to fabricating improved dielectric layers for semiconductor metallurgy systems, more specifically for fabricating a dielectric layer for separating and electrically isolating metallurgy layers on a integrated semiconductor device that has a planar surface and is void free.

2. Description of the Prior Art

More efficient utilization of device area in VLSI technology is a prominent objective. In order to decrease cost and increase the speed of operation, the size of the individual elements on integrated circuit semiconductor devices have been continuously reduced and packed closer together and the number of devices increased. The metallurgy system required to interconnect the elements had to undergo a similar reduction in size. Additional layers of metallurgy were also required to interconnect the larger number of elements on a single chip. As the number of metallurgy layers increased, and the passivation layers between the layers became thinner, the planarity of each successive layer was reduced. The exposure of resist layers used to fabricate the devices demanded a very fine and concise pattern. However, the depth of field of the exposure apparatus prevented the necessary precise pattern exposure because of the non planarity of the passivating layers. Techniques were developed to planarize the passivating layers, as is shown in FIGS. 1–4. An advanced technique consists of depositing a metallurgy pattern 10, using conventional photolithographic and etching techniques, on a insulating layer 11 supported on semiconductor substrate 12, as shown in FIG. 1. The metallurgy pattern 10 is then covered with a thin conformed layer 14, using chemical vapor deposition (CVD) techniques, as shown in FIG. 2. A non conformed layer 16 is deposited over layer 14 using spin-on-glass (SOG) techniques, which per se are well known. As shown in FIG. 3, layer 16 has a substantially planar top surface. However, when the spacing of the metallurgy lines of metallurgy pattern 10 is very small a void 18 can occur. The voids can occur at or below a 0.6 micrometer feature size. The voids occur because the spacing is so narrow that the spaces cannot be filled with the spin-on-glass material. The voids are objectionable because their presence in the final product causes poor reliability, that is failure during the use of the integrated circuit in the field. Conventionally, the SOG layer 16 is etched back to further planarize the surface and a layer 20 of silicon oxide, $SiO_2$ is deposited, preferably by chemical vapor deposition (CVD) techniques, as shown in FIG. 4. With the etch back, and CVD layer 20, the void 18 has not been avoided.

SUMMARY OF THE INVENTION

An object of the invention is to provide an improved process for producing a metallurgy system for a semiconductor device that has a passivating layer having a planar surface and an absence of voids in the layer.

Another object of the invention is to provide planar imperious insulating layer for a microminiturized metallurgy system.

In accordance with the afore-mentioned objective there is provided a fabrication wherein a blanket metal layer is deposited on a semiconductor substrate provided with an overlying insulating layer. A relatively thick blanket layer of insulating material is then deposited over the metal layer. A photoresist layer is deposited, exposed and developed to define the desired metallurgy pattern, and the exposed areas of the insulating layer and underlying metal layer etched away. After the photoresist layer is removed, a thin conformal layer is formed over the metallurgy pattern, and a thick SOG layer deposited over the conformal layer. The SOG layer is etched back and a conformal $SiO_2$ layer deposited. The metallurgy system is completed by repeating the foregoing steps to provide additional metallurgy levels.

BRIEF DESCRIPTION OF THE DRAWINGS

FIGS. 1–4 is a sequence of cross sectional views, in broken section, in greatly enlarged scale, that illustrate a conventional method of fabricating a metallurgy system for semiconductor devices provided with an insulating layer having a planar surface.

FIGS. 5 through 11, is a sequence of cross sectional views, in broken section that illustrates the method of invention of fabricating a microminiturized metallurgy system with imperious passivating layers having planar surfaces.

DETAILED DESCRIPTION OF PREFERRED EMBODIMENTS OF THE PROCESS

Figure 7:
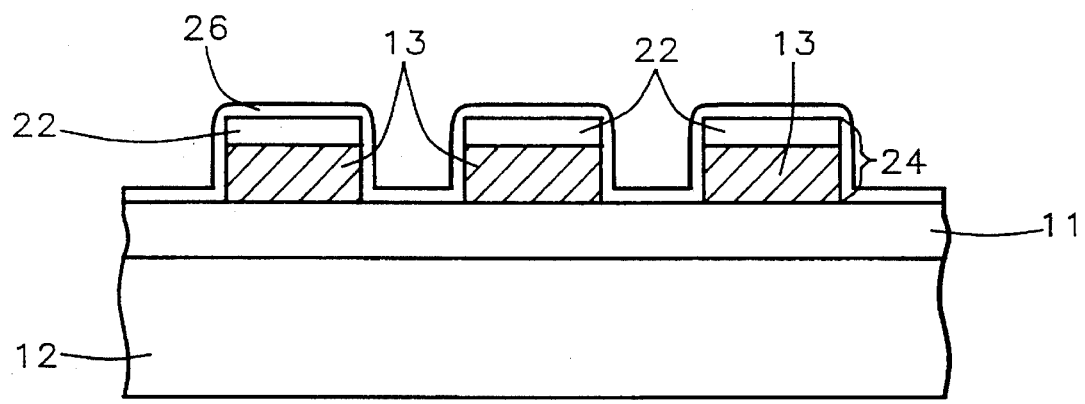

Referring now to the FIG. 5–11 of the drawings, there is depicted the process of the invention. As blanket metal layer 13, is deposited on substrate 12 having an overlying insulating layer 11. Layer 11 is typically a layer of thermal $SiO_2$ having a thickness in the range of between about 1000 to 15000 Angstroms. Substrate 12 is typically monocrystalline silicon, but could be any type of semiconductor material. The metal of the metal layer can be of any suitable conductive metal, such as aluminum (Al), doped polycrystalline silicon, refractory metal, or the like. The thickness of layer 13 is typically in the range of between about 1000 to 15000 Angstroms, and can be deposited by any suitable technique, preferably by a sputtering process at temperature between about 0° to 700° C. and a vacuum of less than about 1 mtorr. An alternative preferred process for deposition is by CVD at a temperature between about 150° to 1000° C. and a pressure of between about $1 \times 10^{-3}$ mtorr to 1 torr. A relatively thick blanket layer 22 of insulating material, preferably $SiO_2$, is deposited over layer 13. Layer 22 can be deposited by any suitable technique, preferably by atmospheric pressure chemical vapor deposition (APCVD) in a pressure range of between about 0.1 to 2.0 atmospheres, at a temperature of between about 350° to 600° C., and using a silane or tetraethylorthosilicate (TEOS) base gas. Alternatively, plasma enhanced chemical vapor deposition (PECVD) can be used with an RF power of between about 200 to 5000 watts, and a silane or tetraethylorthosilicate (TEOS) base gas. The preferred deposition thickness is between about 500 to 5000 Angstroms.

A photoresist layer (not shown) is then deposited over layer 22, exposed, and developed to define a metallurgy pattern. Typically the pattern will include stripes with a narrow spacing. As shown in FIG. 6, the exposed areas of layers 13 and 22 are removed by etching leaving a metallurgy pattern 24 consisting of a metal layer 13 and an overlying $SiO_2$ layer 22. The exposed portions of layer 22 and 13 are removed by anisotropic etching, which leaves the remaining layer portions of metallurgy pattern 24 with vertical sidewalls. The etching of $SiO_2$, layer 22 is achieved by reactive ion etching (RIE) using an RF power of between about 200 to 5000 watts using fluoromethane, $CH_3F$, carbon tetrafluoride, $CF_4$, or $C_2F_6$, and oxygen/hydrogen, $O_2/H_2$. The etching of metal layer 13 is achieved by use of for example an ambient of chlorine, $Cl_2$, and boron trichloride, $BCl_3$ using a RF power of between about 200 to 5000 watts.

As shown in FIG. 7, a conformal thin $SiO_2$ layer 26 is deposited over metallurgy pattern 24. Layer 26 has a thickness in the range of between about 100 to 2000 Angstroms, and is deposited by chemical vapor deposition techniques. The layer can be deposited by processes as described in regard to layer 22 above.

Figure 8:
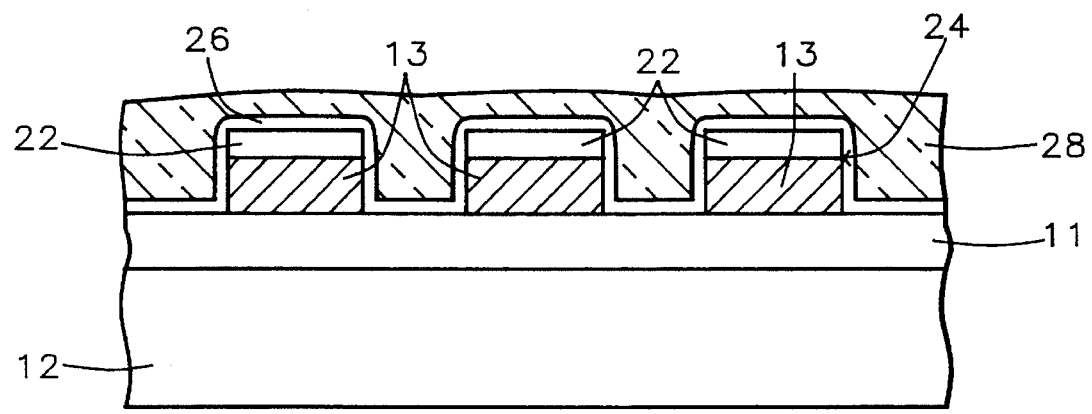

A non-conformal layer 28 is then deposited over layer 26, as shown in FIG. 8. Layer 28 is deposited by spin-on-glass techniques and cured, and has a relatively planar top surface. The layer 28 is formed of siloxane or silicate material, and can be deposited by spinning, baked at between about 100° to 300° C. for 20 seconds to 3 minutes and cured at between about 200° to 500° C. for 5 minutes to 3 hours. Alternatively, layer 28 can be silicon oxide material deposited by a TEOS/ozone process. Layer 28 can also be composed of a polyimide material.

The layer 28 covers layer 26, over metallurgy pattern 24, to a depth, typically in the range of between about 300 to 3000 Angstroms. The layer has a depth of between about 1000 to 15000 Angstroms on the region without pattern 24. Note that the presence of layer 26 permits filling in all of the spaces between the stripes of metallurgy pattern 24 without leaving voids as in the prior art process.

Our invention prevents the voids from being formed in narrow spaces, by using a very thin layer 26 that does not fill or close the narrow spaces between the metal stripes. Further, the layer 26, which covers the metal stripes 13 protects the metal from exposure to the spin-on-glass, SOG etch back ambient.

Figure 9:
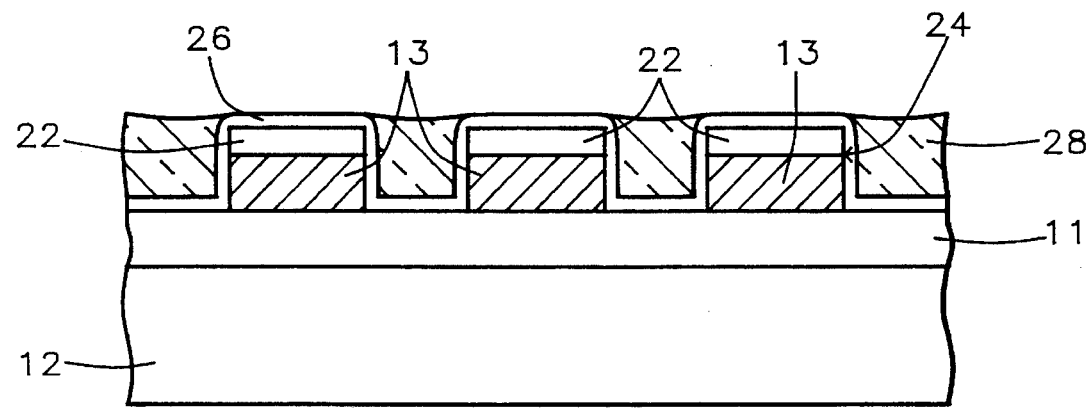
Figure 10:
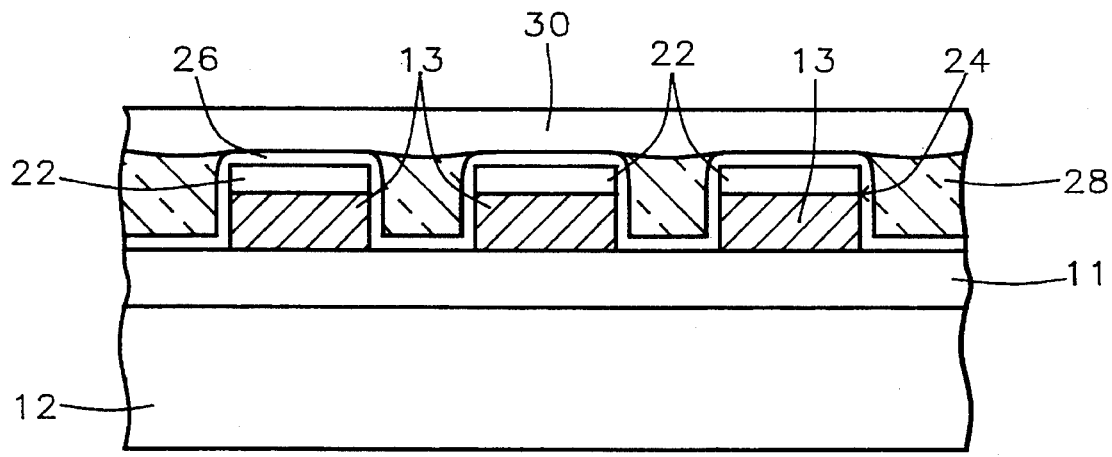

The layer 28 is etched back with a reactive plasma etch to further planarize the top surface, as shown in FIG. 9. The etch back preferably continues until the oxide layer 22 over metal stripes 13 is exposed. As shown in FIG. 10, a top layer 30 of insulating material, typically $SiO_2$, is deposited on the surface of the etched back substrate. Layer 30 can be formed by CVD techniques. The thickness of layer 30 is typically in the range of between about 1000 to 15000 Angstroms.

Additional levels of metallurgy can be formed over the aforedescribed layer structure to build up a multilevel metallurgy system. The additional metallurgy layer levels can be fabricating by repeating the aforedescribed process sequence. The planar nature of the surface of each level makes possible the exposure of a fine sharp pattern in the photoresist layer.

Figure 11:
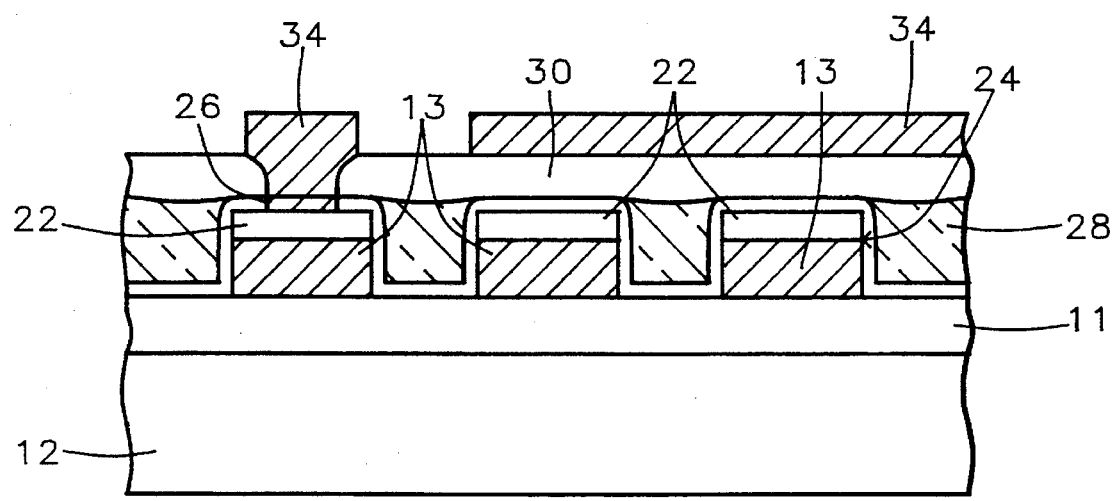

FIG. 11 illustrates the structure of the top final layer. A via hole 32 is formed through layers 30 and 22 to expose metal layer stripe 13. A metallurgy pattern 34 is then formed using conventional well known techniques. An insulating layer (not shown) is deposited over metallurgy pattern 34.

While the invention has been particularly shown and described with reference to the preferred embodiments thereof, it will be understood by those skilled in the art that various changes in form and details may be made without departing from the spirit and scope of the invention. For example, it will be understood that the inventive process of the invention can also be used for multi-layer interconnect on the top of pattern 34. The process can be used at each succeeding metallurgy level.

What is claimed is:

1. A method of fabricating a metallurgy pattern and an overlying insulating layer having a planar surface on a semiconductor substrate comprising:

providing a semiconductor substrate with a surface dielectric layer, depositing a blanket metal layer on said surface dielectric layer by chemical vapor deposition techniques at a temperature between 150° an 1000° C. and at pressure between $1 \times 10^{-3}$ mtorr to 1 torr, depositing a blanket insulating layer of material over the blanket metal layer, depositing, exposing and developing a photoresist layer on the blanket layer of insulating material that defines a metallurgy pattern, and exposes areas of the underlying blanket insulating layer, removing by reactive ion etching the exposed areas of the blanket insulating layer at a power of 200 to 5000 watts in a reactive plasma selected from the group consisting of $CH_3F$, $CF_4$ and $C_2F_6$, leaving exposed areas of blanket metal layer, removing by reactive ion etching the exposed areas of blanket metal layer at a power of 200 to 5000 watts is a reactive plasma selected from the group consisting of $CH_3F$, $CF_4$ and $C_2F_6$, depositing over the metallurgy pattern a conformal silicon oxide layer having a thickness which does not fill or close any spaces between within said metallurgy pattern using chemical vapor techniques, depositing a planarizing layer of insulating material over said conformal silicon oxide layer and etching the planarizing layer with a reactive plasma etch to at least uncover the conformal silicon oxide layer over the metallurgy pattern, and depositing a top surface conformal silicon oxide layer using chemical vapor deposition techniques, and etching via openings to the metallurgy pattern.

2. The method of claim 1 wherein the thickness of the blanket metal layer is in the range of 1000 to 15000 Angstroms.

3. The method of claim 1 wherein the thickness of the planarizing layer of insulating material is in the range of 500 to 5000 Angstroms.

4. The method of claim 1 wherein said conformal silicon oxide layer has a thickness in the range of between about 100 to 2000 Angstroms.

5. The method of claim 4 wherein said planarizing layer is deposited so that the thickness above said conformal silicon oxide layer is in the range of between about 1000 to 15000 Angstroms.

6. The method of claim 1 wherein at least one additional layer of metallurgy and an overlying dielectric are deposited by repeating the forgoing process steps.

7. The method of claim 1 wherein said blanket layer of metal is aluminum.

8. The method of claim 5 wherein said spin-on-glass is a siloxane material.

9. The method of claim 1 wherein said planarizing layer is composed of a TEOS/ozone gas deposited silicon oxide material.

10. The method of claim 1 wherein said planarizing layer is composed of polyimide material.

* * * * *